(12) United States Patent
Shiraishi

(10) Patent No.: US 7,145,987 B2
(45) Date of Patent: Dec. 5, 2006

(54) X-RAY-GENERATING DEVICES AND EXPOSURE APPARATUS COMPRISING SAME

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/084,380

(22) Filed: Mar. 18, 2005

(65) Prior Publication Data

US 2005/0207536 A1    Sep. 22, 2005

Related U.S. Application Data

(63) Continuation of application No. PCT/JP03/09398, filed on Jul. 24, 2003.

(51) Int. Cl.
*H05G 2/00*    (2006.01)
(52) U.S. Cl. ..................... 378/119
(58) Field of Classification Search .......... 378/34, 378/119, 193; 355/67; 250/492.1, 492.2, 250/504 R
See application file for complete search history.

(56) References Cited

U.S. PATENT DOCUMENTS 5,170,418 A * 12/1992 Ebinuma .................. 378/34
6,194,733 B1 * 2/2001 Haas et al. ............. 250/492.2
6,341,006 B1 * 1/2002 Murayama et al. ........... 355/53
6,507,641 B1   1/2003 Kondo et al.
2002/0001363 A1 * 1/2002 Kondo ..................... 378/119
2002/0030799 A1 * 3/2002 Iwasaki et al. .............. 355/53
2002/0041368 A1   4/2002 Kazuya et al.

FOREIGN PATENT DOCUMENTS

| JP | 2000047000 A | * | 2/2000 |
| JP | 2001110709 A | * | 4/2001 |
| JP | 2002-252162 | | 9/2002 |

* cited by examiner

*Primary Examiner*—Edward J. Glick
*Assistant Examiner*—Chih-Cheng Glen Kao
(74) *Attorney, Agent, or Firm*—Klarquist Sparkman, LLP

(57) ABSTRACT

Devices are disclosed for generating X-rays, especially in a vacuum chamber from plasma formed by irradiating a target material with laser light, that provide convenient removal from the vacuum chamber of high-frequency-maintenance components without disturbing other components. In one configuration denoted a liquid-jet-type of X-ray generator, a nozzle (for spraying target material) and a mirror are situated in a vacuum chamber. The nozzle has a higher maintenance frequency than the mirror. A flange member is provided on an outer wall of the vacuum chamber to cover an opening in the wall. The nozzle is connected to a conduit having a base mounted to the flange member. The nozzle is removable for maintenance by detaching the flange member and withdrawing the nozzle through the opening. Thus, the highest-frequency-maintenance component, the nozzle, is removed without moving or removing any other component in the chamber, such as the mirror.

19 Claims, 3 Drawing Sheets

X-RAY-GENERATING DEVICES AND EXPOSURE APPARATUS COMPRISING SAME

CROSS REFERENCE TO RELATED APPLICATION

This application is a continuation of, and claims priority to and the benefit of, PCT Application No. PCT/JP2003/009398, filed on Jul. 24, 2003, which was published as International Publication No. WO 2004/030423 A1 on Apr. 8, 2004, both incorporated herein in their respective entirety.

FIELD

This disclosure relates to X-ray-generating devices that are provided in X-ray equipment such as X-ray microscopes, X-ray analysis apparatus, and X-ray exposure apparatus. The disclosure also pertains to apparatus, such as X-ray exposure apparatus, that include one or more X-ray-generating devices. More particularly, the disclosure relates to X-ray-generating devices and X-ray exposure apparatus in which various components provided in a vacuum chamber housing the X-ray-generating device can be replaced easily for maintenance and other purposes.

BACKGROUND

The conventional art is explained with respect to the example of a liquid-jet-type of X-ray-generating device. FIG. 4 is a cross-sectional view depicting one example of a conventional liquid-jet-type X-ray-generating device. The device of FIG. 4 comprises a light-source chamber 100. The light-source chamber 100 is provided with a vacuum pump 102 that evacuates the interior of the light-source chamber 100. A nozzle 101 is disposed inside the light-source chamber 100. The nozzle 101 is connected to a conduit 103, which is connected to a cylinder (not shown) containing a liquid-gas mixture. A support member 104 extends between the conduit 103 and the inner surface of the light-source chamber 100 to position the nozzle 101 and to prevent misalignment of the conduit 103.

The cylinder for the liquid-gas mixture is filled with a mixture of a target gas, such as xenon (Xe), and a liquid such as water. The liquid-gas mixture is fed from the cylinder to the nozzle 101 via the conduit 103, from which the liquid-gas mixture is sprayed from the tip of the nozzle 101 into the light-source chamber 100. This sprayed liquid-gas mixture forms the target material when generating a plasma.

A mirror (first mirror) 105 is attached via a mount 106 within the light-source chamber 100. The mirror 105 is an elliptical mirror having a reflecting surface 105a, which is bowl-shaped in the present example. The reflecting surface 105a of the mirror 105 is coated with a multilayer film, which in one example is made of alternating layers of Mo and Si. Among the X-rays radiated from the plasma, X-rays in the vicinity of a 13.4-nm wavelength are reflected by the reflecting surface 105a of the mirror 105, and form an X-ray beam. The X-ray beam is guided to a downstream optical system.

A flange member 110 is attached to an outer wall (upper right side in the figure) of the light-source chamber 100. A condenser mechanism 108, including a condenser lens 107, is attached to the outer surface of the flange member 110. A laser-light source 109 is disposed upstream (right side in the figure) of the condenser mechanism 108. The condenser lens 107 condenses laser light L emitted from the laser-light source 109 to the tip of the nozzle 101. A plasma P is produced by irradiating the spray of liquid-gas mixture with the condensed laser light L. X-rays radiate from the plasma P.

The condenser lens 107 and condenser mechanism 108 are attached to the outer surface of the flange member 110 principally because such a manner of mounting is easy from a manufacturing standpoint. The flange member 110 also serves as a sealing cover for a corresponding opening in the light-source chamber 100 used for removing components such as the mirror 105 from the chamber. The flange member 110 thus can be attached to and removed from the outer surface of the light-source chamber 100.

An opening 100a is formed in the lower surface of the light-source chamber 100, through which opening the X-ray beam passes. An X-ray-transmissive filter 111 is disposed inside the light-source chamber 100 at a position that covers the opening 100a. The X-ray-transmissive filter 111 is a thin film made of beryllium (Be) or the like and filters visible and ultraviolet light, also produced by the plasma, from the X-ray beam. An aperture plate 113 is disposed outside of the light-source chamber 100 directly below the X-ray-transmissive filter 111. The aperture plate 113 is a disc having a central pinhole 113a. The X-ray beam reflected by the mirror 105 passes through the pinhole 113a of the aperture plate 113 to the downstream optical system (not shown). Meanwhile, components surrounding the pinhole 113a of the aperture plate 113 block scattered X-rays (leaked light).

In the liquid-jet-type of X-ray-generating device described above, the liquid-gas mixture (target material) and the like form atoms and ionic particles during plasma generation. If these particles become adhered to or are deposited on the tip of the nozzle 101, then the liquid-gas mixture cannot spray normally from the nozzle. Alternatively, if these particles peripherally scatter and adhere to or are deposited on the reflecting surface 105a of the mirror 105, then the reflectance of the mirror 105 is decreased. These scattered particles also can adhere to or become deposited on the X-ray-transmissive filter 111. Consequently, the nozzle 101, the mirror 105, the X-ray-transmissive filter 111, and the like inside the light-source chamber 100 of the X-ray-generating device need to be replaced relatively frequently at fixed respective intervals, and hence are examples of "high-frequency-maintenance components."

To replace high-frequency-maintenance components such as the nozzle 101, the mirror 105, and the X-ray-transmissive filter 111, the flange member 110 is detached from the light-source chamber 100, thereby forming an opening in the chamber wall. The light-source chamber 100 of the conventional device shown FIG. 4 has only one flange member 110. Thus, it is necessary to detach the flange member 110 to remove any of the components such as the nozzle 101, the mirror 105, and the X-ray-transmissive filter 111 for maintenance work. As noted above, for manufacturing simplicity, the condenser lens 107 and condenser mechanism 108 also are attached to the flange member 110. Accordingly, when replacing some or all the components (including any of various high-frequency-maintenance components) inside the light-source chamber 100, the condenser lens 107 and the condenser mechanism 108 (which may not need replacement) must first be detached from the flange member 110.

In the liquid-jet-type X-ray-generating device shown in FIG. 4, the high-frequency-maintenance component typically requiring the most frequent maintenance-related replacement is the nozzle 101. The mirror 105 and the X-ray-transmissive filter 111, also regarded as high-frequency-maintenance components, typically require less frequent replacement (the filter 111 typically requiring less frequent replacement than the mirror 105). In view of the depicted arrangement of these components as shown in FIG. 4, the mirror 105 must be detached first in order to replace the nozzle 101. Thus, each time the nozzle 101, having the highest replacement frequency, is replaced, the mirror 105, the condenser lens 107, and the condenser mechanism 108 (all having lower replacement frequencies) also must be detached and removed. Similarly, each time the X-ray-transmissive filter 111 is replaced, the nozzle 101, the mirror 105, the condenser lens 107, and the condenser mechanism 108 all must be detached and removed, too.

Thus, in a conventional X-ray-generating device, replacing certain components for maintenance and other purposes requires that other components not requiring as frequent replacement also be removed in order to detach the components requiring replacement, which makes replacement work complicated and troublesome. Furthermore, if the condenser lens 107 and the condenser mechanism 108 are detached every time replacement work is performed on another component, then the problem arises of having to realign the condenser lens 107 and the condenser mechanism 108 with each other and with the downstream optical system every time maintenance is performed.

SUMMARY

In view of the problems of conventional devices as described above, the instant disclosure provides X-ray-generating devices, and exposure apparatus comprising same, in which replacement of components, especially high-frequency-maintenance components, can be performed easily without detaching, moving, or removing other components not also requiring maintenance.

To such ends, X-ray-generating devices are provided that convert a target material to a plasma inside a vacuum chamber and that radiate X-rays from the plasma. An embodiment of such a device comprises a vacuum chamber containing components such as a mirror on which X-rays produced in the plasma first impinge and an X-ray-transmissive filter. The vacuum chamber includes a removal means allowing removal of components from the chamber that have a high replacement frequency.

Thus, when replacing a desired component, other components (e.g., components having a lower replacement frequency) do not need to be moved or removed. As a result, component removal for maintenance or replacement is simplified because the task is completed without having to detach components not requiring replacement. Furthermore, replacement of a component does not cause or result in misalignment of the X-ray-generating device that otherwise would be caused by having to detach components not requiring replacement.

Desirably, the components are disposed inside the vacuum chamber so that they can be removed in their respective order of replacement frequency, at least without removing elements having lower replacement frequency. More generally, replacement of components is simplified because components having high respective replacement frequencies can be removed from the vacuum chamber without removing components having low replacement frequency. Furthermore, in accordance with the specific type of X-ray-generating device (e.g., gas-type, liquid-jet type, etc.), components can be disposed so that they can be removed in their respective order of high-replacement frequency, while compromising as little as possible the degrees of freedom in the designing of the device and/or ease of manufacturing of the device.

In an embodiment, the subject X-ray-generating device comprises a nozzle that supplies target material into the vacuum chamber. The nozzle has a base that is mounted to a removal means comprising a first "removal member" that is mounted to the vacuum chamber. For example, in a liquid-jet-type of X-ray-generating device, the nozzle, an X-ray-reflective mirror, and the X-ray-transmissive filter have relatively high replacement frequencies (in this order, wherein the nozzle has the highest replacement frequency). By detaching the first removal member, the nozzle can be detached and removed from the chamber without having to detach other components. The removal means also can comprise a second removal member that allows removal of the mirror without having to detach the nozzle. This configuration eliminates any need to adjust the plasma-generating position of the nozzle (e.g., aligning the spray of the target material) every time the mirror is removed for maintenance.

If the X-ray-transmissive filter is attached to the outer surface side of the vacuum chamber, the removal means can comprise a removal member disposed in an exposure chamber connected or otherwise situated downstream of the vacuum chamber. Thus, the X-ray-transmissive filter can be detached via the exposure chamber without detaching components in the vacuum chamber.

X-ray-generating devices generally convert a target material into a plasma inside a vacuum chamber to cause radiation of X-rays from the plasma. Another embodiment of such a device comprises components, inside the vacuum chamber, such as a mirror on which X-rays from the plasma first impinge and an X-ray-transmissive filter. The vacuum chamber comprises a dedicated removal window for externally removing from the vacuum chamber any components having a high replacement frequency. Thus, the high-replacement-frequency components can be removed from the vacuum chamber without moving or removing other components.

An exemplary embodiment of an exposure apparatus comprises any of the X-ray-generating devices summarized above, an illumination-optical system that irradiates a patterned mask with X-rays from the X-ray-generating device. The apparatus also includes a projection-optical system that projects X-ray light reflected from the mask onto an exposure-sensitive substrate on which an image of the mask pattern is formed.

Components referred to herein can encompass any and all components that, from a performance standpoint, are essential to replace, including any of the constituent components of a light-source device for an exposure apparatus, an illumination-optical system, and a projection-optical system. The components also can encompass components such as fasteners and the like used for attaching other components (e.g., a mirror) to the vacuum chamber, as well as components of, e.g., a cooling mechanism for cooling the mirror.

DETAILED DESCRIPTION OF PREFERRED EMBODIMENTS

Figure 1:
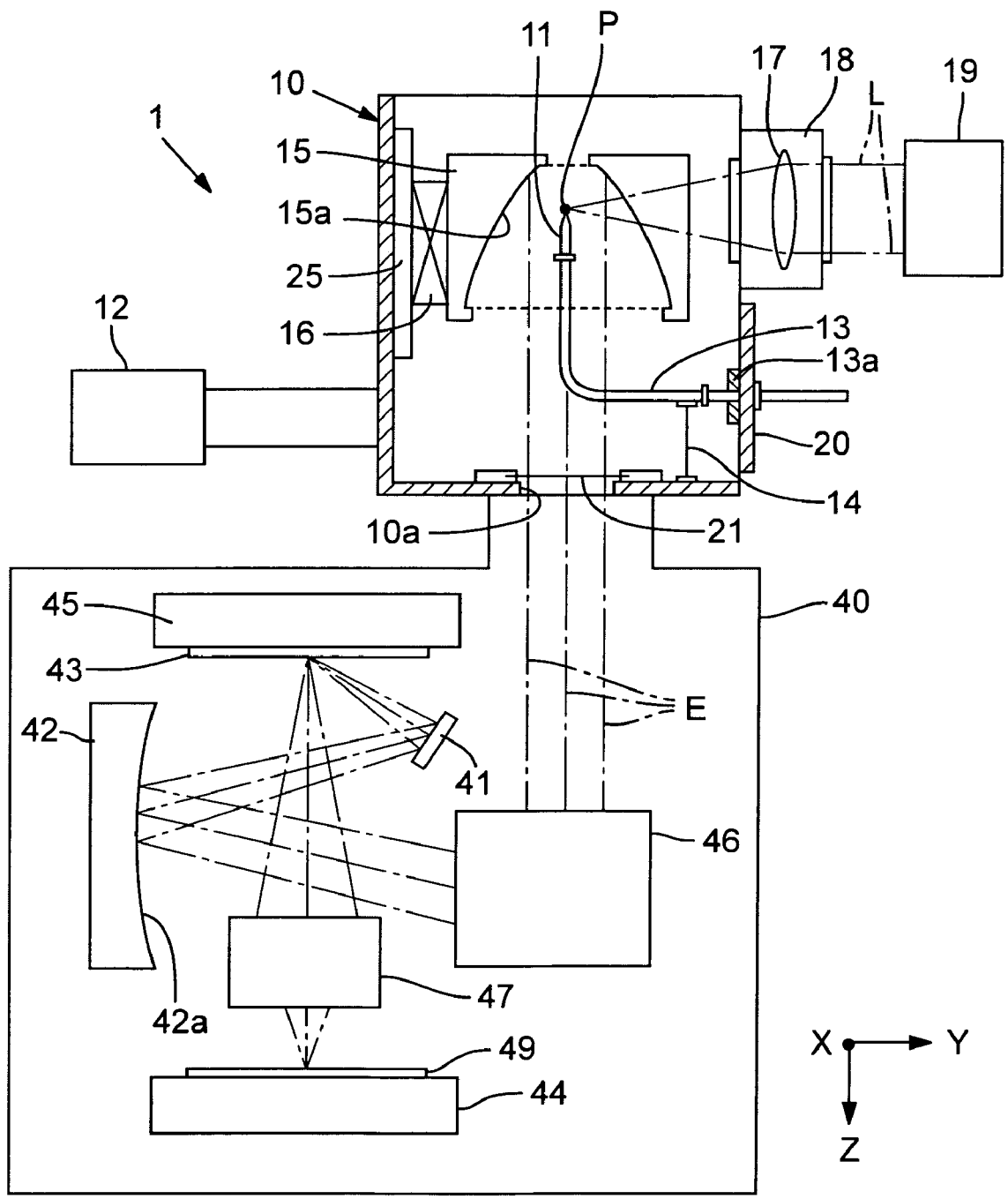
FIG. 1 is an elevational view of an exposure apparatus, including an X-ray-generating device, according to one embodiment.

FIG. 1 depicts an exposure apparatus, including an X-ray-generating device (light source), according to one embodiment. The following description is set forth in the context of the exposure apparatus that uses a laser-plasma light source. However, the apparatus also can be used with, for example, a discharge-plasma light source, or other suitable source of X-ray light.

The FIG. 1 embodiment includes a liquid-jet-type X-ray-generating device 1 located at the most upstream (upper part in the figure) portion of the depicted optical system of the exposure apparatus. The X-ray-generating device 1 comprises a light-source chamber 10. Connected to the light-source chamber 10 is a vacuum pump 12; hence, the light-source chamber 10 is a vacuum chamber. The vacuum pump 12 evacuates the interior of the light-source chamber 10. Because the vacuum pump 12 creates a vacuum (rarefied atmosphere) inside the light-source chamber 10, X-rays generated and propagating inside the chamber are not attenuated.

A nozzle 11 is disposed inside the light-source chamber 10. The nozzle 11 is connected to a conduit 13, which is connected to a supply (e.g., a cylinder, not shown) of a liquid-gas mixture. A support member 14 extends between the conduit 13 and the inner surface of the light-source chamber 10 to position the nozzle 11 and prevent misalignment of the conduit 13. The supply of liquid-gas mixture is a mixture of a target gas, such as xenon (Xe), and a liquid such as water. The liquid-gas mixture is supplied to the nozzle 11 via the conduit 13, and is sprayed from the tip of the nozzle 11 into the light-source chamber 10. The sprayed liquid-gas mixture is used as the target material for generating a plasma P; the plasma P is produced as the target material released from the nozzle 11 is irradiated by a laser beam L.

It will be understood that the embodiment shown in FIG. 1 is not limited to an X-ray-generating device that produces X-rays from a liquid as a target material. Alternatively, a gas or solid may be used as the target material. If a solid target material such as tin is used, the target material can be discharged into the chamber 10 in tape form, or otherwise manufactured in tape form. In the latter instance, the tape can be supplied using a tape-winding device (not shown) that gradually changes the position on the tape at which the plasma-generating laser beam L strikes.

Inside the light-source chamber 10, a mirror (first mirror) 15 is attached via a mount 16 and a slide mechanism 25. The mirror 15 is an elliptical mirror having a reflecting surface 15a that is bowl-shaped in this embodiment. The reflecting surface 15a of the mirror 15 is coated with a multilayer film such as alternating layers of Mo and Si, for example. The X-rays radiated from the plasma P produced in the chamber include X-rays in the vicinity of 13.4 mm wavelength. These X-rays are reflected by the reflecting surface 15a of the mirror 15 and thus formed into an X-ray beam E. The beam E is guided to a downstream optical system (lower portion of FIG. 1).

A removable "flange member" 20 (or analogous removal means) is mounted to the outer wall of the light-source chamber 10, specifically to the lower right portion of the wall shown in FIG. 1. The flange member 20 covers an opening in the wall that can be opened (by removing the flange member 20) to remove components such as the mirror 15 from the light-source chamber 10. Also removable from the chamber 10 by detaching the flange member 20 are the base end 13a of the conduit 13 (which is attached to the flange member 20). Thus, the conduit and nozzle 11 are removable from the chamber 10.

If the mirror 15 is in the way when removing the nozzle 11, then a slide mechanism 25 can be used to slide the mirror 15 upward in FIG. 1. After detachment and replacement of the nozzle 11 have been completed, the mirror 15 can be returned to its original position by sliding it back downward in FIG. 1 using the slide mechanism 25. If, when replacing the nozzle 11, the mirror 15 also needs replacement, the mirror is removed from the chamber 10 through the opening normally covered by the flange member 20. Replacement of the mirror 15 is facilitated by lowering the mirror 15 using the slide mechanism 25 after detaching the nozzle 11. Thus, the slide mechanism 25 facilitates removal of the nozzle 11 and the mirror 15 sequentially through the same opening covered by the flange member 20. It is desirable that the mirror as mounted to the slide 25 include a mirror-alignment mechanism (not shown) to ensure easy and accurate return of the mirror 15 to its original position before commencing removal.

The FIG. 1 embodiment includes a condenser mechanism 18 comprising a condenser lens 17. The condenser mechanism 18 is attached to the outer wall (upper right side in FIG. 1) of the light-source chamber 10 above the flange member 20. A laser-light source 19 is disposed to the right of the condenser mechanism 18 in FIG. 1. The condenser lens 17 condenses the laser beam L, emitted from the laser-light source 19, so as to converge the beam L at the tip of the nozzle 11. Thus, immediately as the mixture of liquid and gas is discharged from the nozzle 11, the mixture is irradiated with the condensed laser beam L, which produces a plasma P from which X-rays radiate.

An opening 10a for passing the X-ray beam E is defined in the lower surface of the light-source chamber 10. An X-ray-transmissive filter 21 is disposed inside the light-source chamber 10 so as to cover the opening 10a. The X-ray-transmissive filter 21 can be a thin film of beryllium (Be) or the like for filtering visible and ultraviolet light from the X-ray beam.

The overall operation of the X-ray-generating device 1 of FIG. 1 will now be explained. The laser beam L emitted from the laser-light source 19 is transmitted through the condenser lens 17 and converged at a point immediately above the nozzle 11. The liquid-gas mixture sprayed from the nozzle 11 receives the energy of the condensed laser light L, which greatly increases the temperature of the mixture to a level sufficient to produce a plasma P. As ions in the plasma P transition to a lower potential state, X-rays are emitted from the plasma. Among the X-rays that impinge upon the mirror 15, X-rays having a wavelength in the vicinity of 13.4 nm are reflected by the reflecting surface 15a into an X-ray beam E that is guided from the downstream side of the light-source chamber 10 to a downstream optical system.

If the X-ray-generating device 1 is operated for a certain time period, particles produced in and scattered from the plasma P become deposited, for example, at the spray opening of the nozzle 11 and on the reflecting surface 15a of the mirror 15. Excessive depositions of this nature raise the need periodically to replace the nozzle 11 and mirror 15. As discussed earlier, the component in a liquid-jet-type of X-ray-generating device 1 that requires the highest frequency of replacement is the nozzle 11. In the embodiment shown in FIG. 1, replacement of the nozzle 11 only requires removal of the flange member 20; it is unnecessary to detach the mirror 15, the X-ray-transmissive filter 21, the condenser lens 17, or the condenser mechanism 18 (all of which having respective replacement frequencies that are lower than of the nozzle 11). Consequently, replacement of the nozzle 11 is simple and easy because the replacement can be completed without detaching other components not requiring replacement. Furthermore, replacing the nozzle 11 does not cause misalignment that otherwise would be caused by having to detach the condenser lens 17 and/or the condenser mechanism 18, for example.

Further aspects of the exposure apparatus shown in FIG. 1 are as follows. An exposure chamber 40 is disposed downstream (below in the figure) the X-ray-generating device 1. An illumination-optical system 46 is disposed inside the exposure chamber 40. The illumination-optical system 46 comprises a reflective mirror that is part of a condenser system, a reflective mirror that is part of a fly-eye optical system, and other optical elements as required. (These constituent elements are not detailed.) The illumination-optical system 46 forms the illumination X-ray beam E into a beam having an arc-shaped transverse section; this shaped beam propagates leftward in FIG. 1 toward an X-ray-reflective mirror 42. The mirror 42 has a reflective surface 42a having a circular concave profile. The mirror 42 is supported vertically in the exposure chamber 40 by a support member (not shown). A light-path-bending reflective mirror 41 is diagonally disposed to the right of the mirror 42 in FIG. 1, and thus directs the illumination beam to a reflective-type mask 43, which is horizontally disposed above the light-path-bending mirror 41. The reflective surface of the mask 43 faces downward in FIG. 1. Thus, X-rays emitted from the illumination-optical system 46 are reflected and condensed by the X-ray-reflective mirror 42 and propagate to the reflective surface of the mask 43 via the light-path-bending reflective mirror 41.

The substrates of each of the reflective mirrors 41, 42 comprise a quartz material on which the respective reflective surfaces can be fabricated with high precision. A Mo/Si multilayer film is formed on the reflective surface 42a and on the reflective surface of the mirror 41, similar to the reflective surface of the mirror 15 of the X-ray-generating device 10. (If X-rays having a wavelength of 10–15 nm are used, then the multilayer film alternatively can be formed of alternating layers of a first substance such as Ru (ruthenium) or Rh (rhodium) and a second substance such as Si, Be (beryllium), or $B_4C$ (boron carbide).)

A reflective film comprising a multilayer film is also formed on the reflective surface of the reflective mask 43. A mask pattern is formed on the reflective film of the mask, wherein the mask pattern corresponds to the pattern to be transferred to a wafer 49 or other suitable substrate. The reflective-type mask 43 is mounted to and supported by a mask stage 45 situated above the mask. The mask stage 45 is movable in at least the Y direction, and the X-rays reflected by the light-path-bending mirror 41 are irradiated onto the mask 43 in a manner by which respective pattern-defining regions on the mask are sequentially illuminated.

A projection-optical system 47 and the wafer 49 are disposed downstream of the reflective-type mask 43. The projection-optical system 47 comprises a plurality of reflective mirrors and the like, and is operable to reduce (demagnify) the X-rays reflected by the mask 43 at a prescribed reduction ratio (e.g., 1/4) and form an image on the wafer 49 of the illuminated mask pattern. The wafer 49 is mounted, by chucking or other suitable manner, to a wafer stage 44 that is movable in the X, Y, and Z directions.

When performing an exposure, the reflective surface of the reflective-type mask 43 is irradiated with X-rays by the illumination-optical system 46. Meanwhile, the reflective-type mask 43 and the wafer 49 are synchronously scanned relative to the projection-optical system 47 at a prescribed velocity ratio determined by the reduction ratio of the projection-optical system 47. Thus, the entire circuit pattern defined on the mask 43 is transferred to each of a plurality of shot regions on the wafer 49 in a step-and-scan manner. An exemplary "chip" as formed on the wafer 49 by a protocol including these exposures is, for example, a 25×25 mm square.

Figure 2:
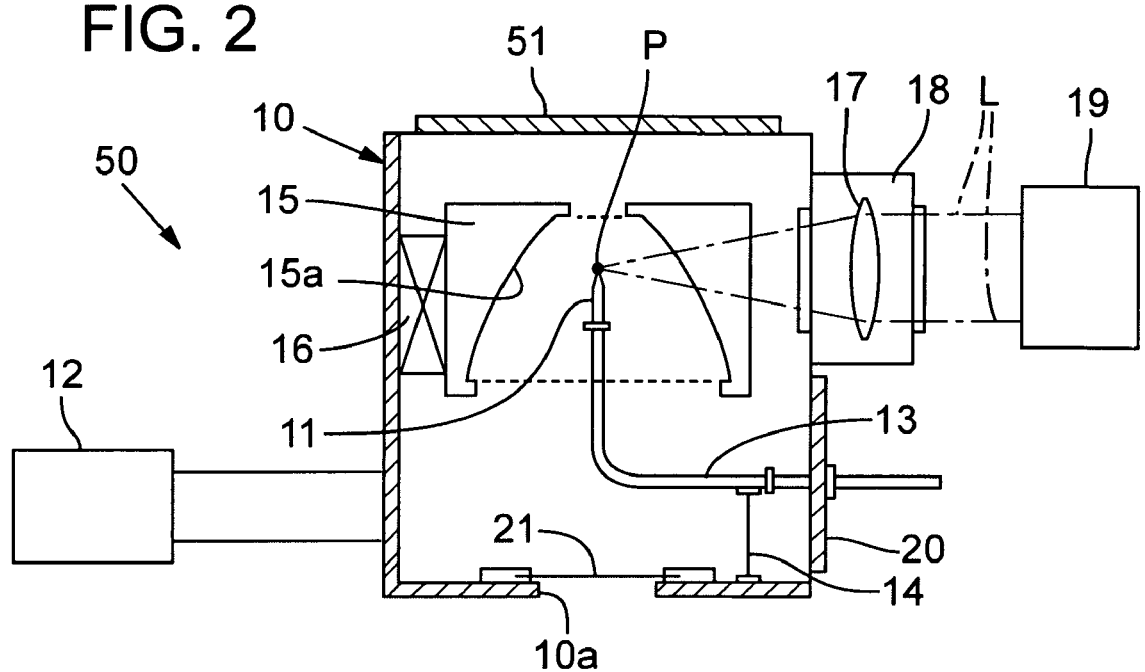
FIG. 2 is an elevational view of an X-ray-generating device according to a second embodiment.

A second embodiment of an X-ray-generating device is shown in FIG. 2. Components shown in FIG. 2 that are substantially similar to corresponding components shown in FIG. 1 have the same respective reference numerals. Compared to the X-ray-generating device 1 shown in FIG. 1, the X-ray-generating device 50 of FIG. 2 significantly differs principally in the following two points:

(1) The X-ray-generating device 50 of FIG. 2 is a gas type. Namely, the conduit 13 connected to the nozzle 11 is connected to a supply (e.g., a cylinder, not shown) of target gas, not a mixture of gas and liquid. The target gas is, for example, krypton (Kr). The target gas from the supply is delivered to the nozzle 11 via the conduit 13, and is sprayed from the tip of the nozzle 11 into the light-source chamber 10. The sprayed target gas is the target material used for generating the plasma P.

(2) A second flange member 51 is provided on the upper surface of the light-source chamber 10. The second flange member 51 is a removal member that, when in place, sealingly covers a corresponding opening in an upper wall of the light-source chamber 10. The second flange member 51 can be attached and removed from the light-source chamber 10.

In the gas-type X-ray-generating device 50 of FIG. 2, the mirror 15, the nozzle 11, and the X-ray-transmissive filter 21 have high replacement frequencies, wherein the mirror 15 has the highest replacement frequency and the filter 21 has the lowest replacement frequency. With the device 50 of this embodiment, detaching the flange member 51 to open the upper wall of the light-source chamber 10 permits ready detachment and removal of the mirror 15 (having the highest replacement frequency). Meanwhile, it is unnecessary to detach the nozzle 11, the X-ray-transmissive filter 21, the condenser lens 17, or the condenser mechanism 18 (all of which having respective replacement frequencies that are lower than of the mirror 15). Thus, it is unnecessary to detach and realign the nozzle 11 every time the mirror 15 is removed, which eliminates tedious work such as having to adjust the plasma-generating position (aligning the spray of target material from the nozzle) each time maintenance is performed.

Furthermore, providing the second flange member 51 shown in FIG. 2 allows ready removal of the mirror 15, the nozzle 11, and the filter 21 (in this order) through the upper wall of the light-source chamber 10 without having to remove the flange member 20. Consequently, in situations in which manufacturing of the device otherwise may be compromised, the flange member 20 can be eliminated. But, in view of the convenience of the flange member 20 for detaching the nozzle 11 and the X-ray-transmissive filter 21, it is desirable and convenient to provide both flange members 51, 20 in a single device.

Although the embodiment of FIG. 2 was explained in the context of it being a gas-type X-ray-generating device, it alternatively can be a liquid-jet type X-ray-generating device, as described generally above with respect to FIG. 1, including the flange member 51.

Figure 3:
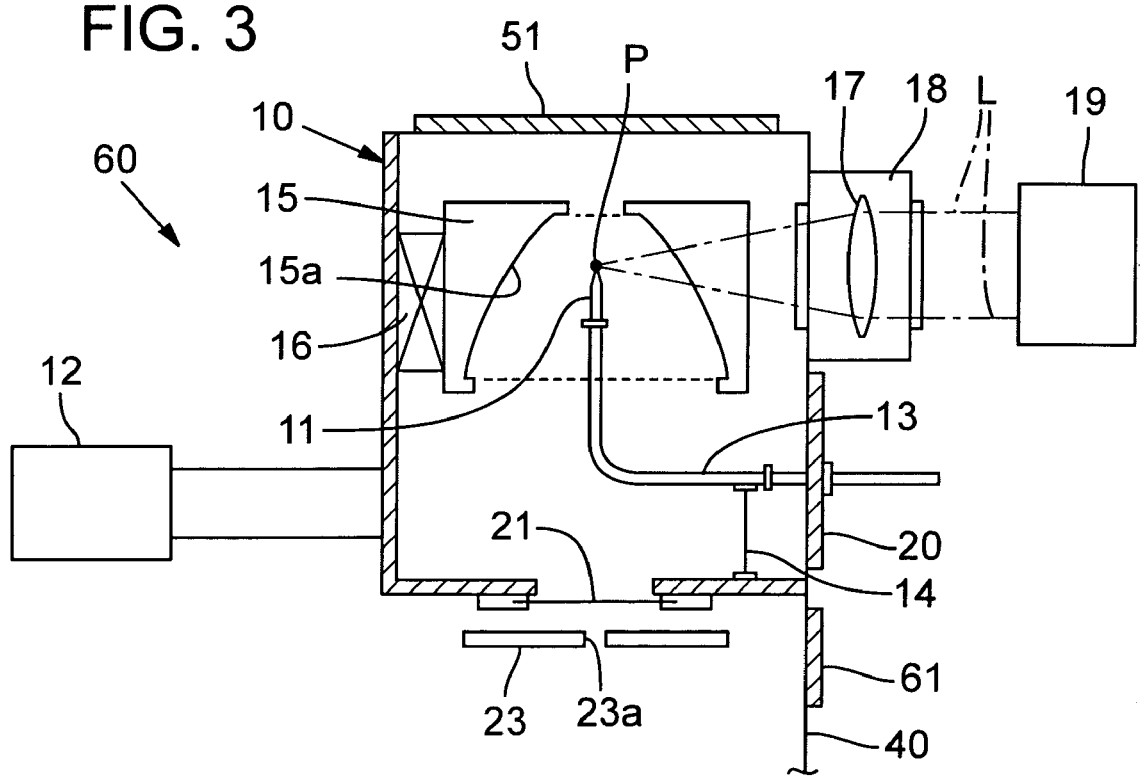
FIG. 3 is an elevational view of an X-ray-generating device according to a third embodiment.
Figure 4:
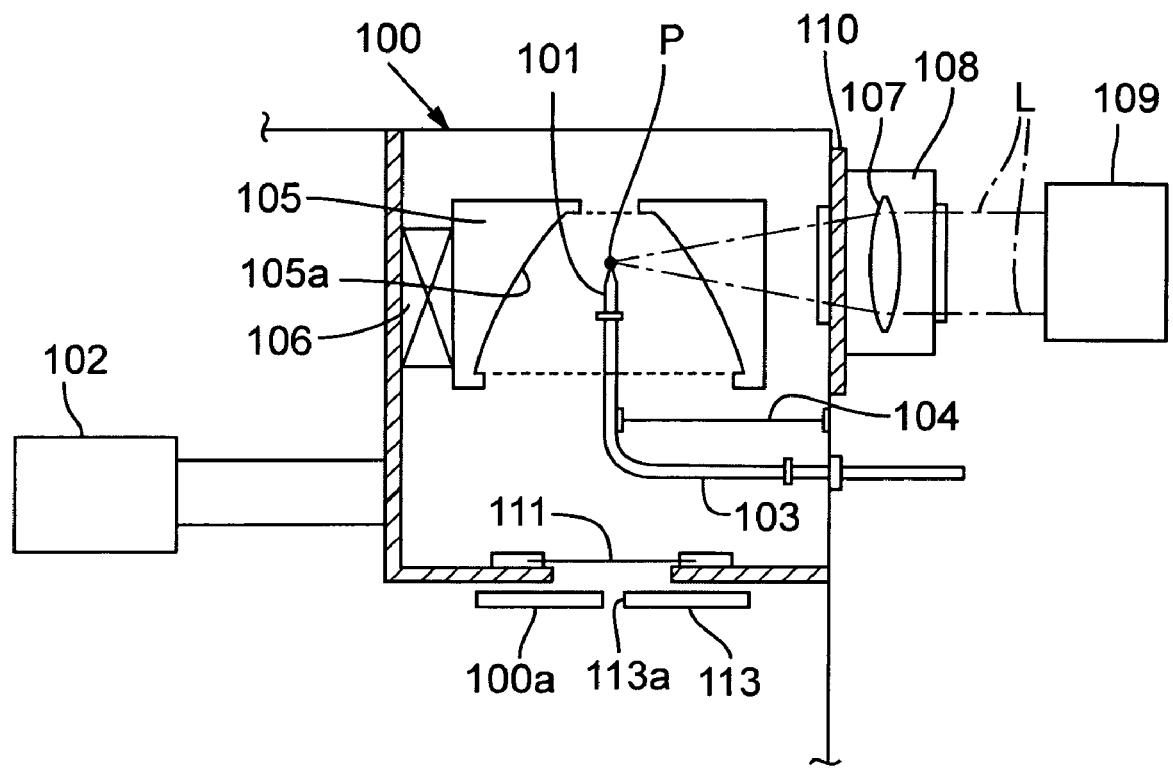
FIG. 4 is an elevational view of an example of a conventional liquid-jet-type X-ray-generating device.

FIG. 3 depicts a third embodiment of an X-ray-generating device 60. Components in FIG. 3 that are substantially similar to respective components of the embodiments of FIGS. 1 and 2 have the same reference numerals. Compared to the X-ray-generating device 50 shown in FIG. 2, the X-ray-generating device 60 of FIG. 3 is substantially different principally in the following two points:

(1) In the X-ray-generating device 60 of FIG. 3, the X-ray-transmissive filter 21 is attached to the outer surface of the light-source chamber 10. In addition, in FIG. 3, an aperture plate 23 is disposed directly below (downstream of) the X-ray-transmissive filter 21. The aperture plate 23 is a disc that defines a pinhole 23a at its center. The diameter of the pinhole 23a is, for example, on the order of 1 µm. The X-ray beam reflected by the mirror 15 passes through the pinhole 23a of the aperture plate 23 and arrives at the downstream optical system (not shown, but see FIG. 1). As X-rays pass through the pinhole 23a, more outlying (e.g., scattered) portions of the X-ray beam are blocked by the aperture plate 23. Even though a component corresponding to the aperture plate 23 is present in the apparatus shown in FIG. 1, the aperture plate itself is not shown in FIG. 1.

(2) A third flange member 61 is provided on the side wall of the exposure chamber 40 (see FIG. 1) downstream of the light-source chamber 10. The third flange member 61 is removable and is situated on the exposure chamber 40 upstream of the illumination-optical system 46 (FIG. 1) inside the exposure chamber 40.

In the X-ray-generating device 60 of FIG. 3, replacement of the nozzle 11 can be accomplished by detaching the flange member 20, replacement of the mirror 15 can be accomplished by detaching the second flange member 51, and replacement of the X-ray-transmissive filter 21 can be accomplished by detaching the third flange member 61. Thus, regardless of the required frequency of replacement of these components, the flange member corresponding to the respective component can be removed to create a respective removal "window." The affected component can be removed via the respective removal window and replaced. Thus, there is no need to detach any other component not requiring replacement at the same time.

Furthermore, the performance of the aperture plate 23 does not deteriorate very much because most of the X-ray beam basically passes through the pinhole 23a. Nevertheless, scattered X-rays irradiating portions of the aperture plate 23 surrounding the pinhole 23a can cause deterioration. Consequently, the aperture plate 23 does require periodic replacement. Replacing the aperture plate 23 can be achieved by detaching the third flange member 61.

As can be understood from the foregoing, X-ray-generating devices, and exposure apparatus comprising same, are provided that allow for easy replacement of components that are accessorily provided in a vacuum chamber.

What is claimed is:

1. An X-ray-generating device that converts a target material to a plasma that radiates X-rays, the device comprising:
  a vacuum chamber into which the target material is introduced;
  multiple high-frequency-maintenance components located inside the vacuum chamber; and
  multiple removal means associated with the vacuum chamber, at least two of said removal means being for providing, during a maintenance event, access inside the vacuum chamber for removing at least one respective high-frequency-maintenance component from the vacuum chamber without having to detach or remove another high-frequency-maintenance component in the vacuum chamber not requiring moving or removal during the maintenance event of the respective at least one component.

2. The device of claim 1, further comprising:
  a laser-light source that produces a beam of laser light; and
  a light-optical system situated and configured to direct the beam of laser light to the target material and thus cause the target material to form the plasma that radiates the X-rays.

3. The device of claim 1, wherein:
  the vacuum chamber is defined by walls; and
  at least one of said removal means comprises a flange member attached to a wall of the vacuum chamber and covering a respective opening in the wall through which the at least one respective high-frequency-maintenance component is removed.

4. The device of claim 1, wherein:
  the high-frequency-maintenance components are disposed in the vacuum chamber so as to be removable in order of their respective frequencies of maintenance; and
  a first of said removal means is situated so as to allow removal of a respective high-frequency-maintenance component requiring more frequent maintenance without having to remove a high-frequency-maintenance component requiring less frequent maintenance.

5. The device of claim 4, wherein the first of said removal means is situated so as to allow removal of the respective component requiring more frequent maintenance without having to move the high-frequency-maintenance component requiring less frequent maintenance.

6. The device of claim 4, wherein:
  the first of said removal means comprises a first removal member mounted to a wall of the vacuum chamber and covering a first opening of the vacuum chamber, and a second of said removal means comprises a second removal member mounted to a wall of the vacuum chamber and covering a second opening of the vacuum chamber;
  the first removal member is situated to allow, when the first removal member is removed from the wall, removal of the respective high-frequency-maintenance component requiring more frequent maintenance through the first opening; and
  the second removal member is situated to allow, when the second removal member is removed from the wall, removal of the respective high-frequency-maintenance component requiring less frequent maintenance through the second opening.

7. The device of claim 6, wherein the first and second removal members are respective flange members.

8. The device of claim 6, wherein:
  the high-frequency-maintenance component requiring more frequent maintenance is a nozzle for introducing the target material into the vacuum chamber;
  the high-frequency-maintenance component requiring less frequent maintenance is an X-ray-reflective mirror situated and configured to reflect the X-rays radiating from the plasma.

9. The device of claim 1, wherein:
  at least one of said removal means comprises a flange member attached to a wall of the vacuum chamber and covering a respective opening in the wall;

the respective high-frequency-maintenance component includes a nozzle situated and configured to discharge a target material inside the vacuum chamber;

the nozzle is removably mounted to the flange member; and detachment of the flange member from the wall removes the nozzle from the vacuum chamber.

10. The device of claim 1, wherein:

the high-frequency-maintenance components include an X-ray-reflective mirror and a nozzle, the nozzle being situated and configured to discharge a target material inside the vacuum chamber, and the mirror being situated and configured to reflect X-rays from the plasma; and the removal means comprise a removable member that, when attached to the vacuum chamber, covers a respective opening in the vacuum chamber and, when removed from the vacuum chamber, allows removal of the mirror through the respective opening without having to detach or remove the nozzle.

11. The device of claim 1, wherein:

a first high-frequency-maintenance component is mounted inside the vacuum chamber on a moving device configured to move the first high-frequency-maintenance component; and a second high-frequency-maintenance component is mounted inside the vacuum chamber; and before removing the second high-frequency-maintenance component from the vacuum chamber via the respective removal means, the first high-frequency-maintenance component is moved by the moving device.

12. The device of claim 11, wherein the moving device comprises a slide.

13. The device of claim 1, further comprising a downstream optical system situated and configured to receive the X-rays exiting the vacuum chamber.

14. The device of claim 13, wherein the downstream optical system comprises an illumination-optical system of an X-ray exposure apparatus.

15. An X-ray exposure apparatus, comprising:

an X-ray-generating device as recited in claim 1;

an illumination-optical system situated downstream of the X-ray-generating device so as to receive the X-rays from the X-ray-generating device and direct the received X-rays to a mask defining a pattern; and a projection-optical system situated downstream of the mask so as to receive X-rays reflected from the mask and direct the received X-rays onto an exposure-sensitive substrate to form an image on the substrate of the mask pattern.

16. An X-ray-generating device in which a target material is converted to a plasma that radiates X-rays, the device comprising:

a vacuum chamber into which the target material is introduced, the vacuum chamber being defined by walls;

multiple high-frequency-maintenance components situated inside the vacuum chamber, the high-frequency-maintenance components including an X-ray-reflective mirror for reflecting the X-rays radiated from the plasma;

an X-ray-transmissive filter through which the X-rays reflected from the mirror pass for exiting the vacuum chamber; and multiple openings defined in a wall of the vacuum chamber and covered with respective removable members that, when mounted to the wall, sealingly cover the openings, at least one of the openings serving as a dedicated removal window for removing at least one of the high-frequency-maintenance components from the vacuum chamber without disturbing other components in the vacuum chamber.

17. The device of claim 16, further comprising a downstream optical system situated and configured to receive the X-rays exiting the vacuum chamber through the X-ray-trasmissive filter.

18. The device of claim 17, wherein the downstream optical system comprises an illumination-optical system of an X-ray exposure apparatus.

19. An X-ray exposure apparatus, comprising:

an X-ray-generating device as recited in claim 16;

an illumination-optical system situated downstream of the X-ray-generating device so as to receive the X-rays from the X-ray-generating device and direct the received X-rays to a mask defining a pattern; and a projection-optical system situated downstream of the mask so as to receive X-rays reflected from the mask and direct the received X-rays onto an exposure-sensitive substrate to form an image on the substrate of the mask pattern.

* * * * *

UNITED STATES PATENT AND TRADEMARK OFFICE
CERTIFICATE OF CORRECTION

PATENT NO. : 7,145,987 B2
APPLICATION NO. : 11/084380
DATED : December 5, 2006
INVENTOR(S) : Masayuki Shiraishi Page 1 of 1

It is certified that error appears in the above-identified patent and that said Letters Patent is hereby corrected as shown below:

In column 5, line 58, the phrase "13.4 mm" should be -- 13.4 nm --.

Signed and Sealed this

Eighth Day of July, 2008

JON W. DUDAS
*Director of the United States Patent and Trademark Office*